United States Patent
Kim et al.

(10) Patent No.: US 8,213,891 B2
(45) Date of Patent: Jul. 3, 2012

(54) GAIN CONTROL APPARATUS AND METHOD IN RECEIVER OF MULTIBAND OFDM SYSTEM

(75) Inventors: Seong-Min Kim, Daejon (KR); Byung-Su Kang, Daejon (KR); Gweon-Do Jo, Daejon (KR); Jae-Ho Jung, Daejon (KR); Joon-Hyung Kim, Daejon (KR); Heon-Kook Kwon, Daejon (KR); Sung-Jun Lee, Daejon (KR); Kwang-Chun Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 434 days.

(21) Appl. No.: 12/507,474

(22) Filed: Jul. 22, 2009

(65) Prior Publication Data

US 2010/0136939 A1    Jun. 3, 2010

(30) Foreign Application Priority Data

Dec. 2, 2008    (KR) .................. 10-2008-0120955

(51) Int. Cl.
*H04B 1/06*    (2006.01)
*H04B 7/00*    (2006.01)

(52) U.S. Cl. ............... 455/234.1; 455/241.1; 455/245.1; 455/245.2; 455/250.1; 375/345

(58) Field of Classification Search ............... 455/232.1, 455/234.1, 235.1, 241.1, 245.1–247.1, 250.1, 455/251.1; 375/345
See application file for complete search history.

(56) References Cited

U.S. PATENT DOCUMENTS

| | | | | |
|---|---|---|---|---|
| 6,480,528 B1 * | 11/2002 | Patel et al. | ..................... | 375/148 |
| 6,838,937 B2 * | 1/2005 | Fanous et al. | ............. | 330/124 R |
| 7,065,165 B2 * | 6/2006 | Heinonen et al. | ............. | 375/345 |
| 7,099,678 B2 * | 8/2006 | Vaidyanathan | ............... | 455/500 |
| 7,277,685 B2 * | 10/2007 | Liu et al. | .................... | 455/240.1 |
| 7,299,021 B2 * | 11/2007 | Parssinen et al. | .......... | 455/226.1 |
| 7,539,469 B2 * | 5/2009 | Zahm et al. | .................... | 455/130 |
| 7,639,998 B1 * | 12/2009 | Halvorson | ................. | 455/251.1 |
| 7,809,343 B2 * | 10/2010 | Lai et al. | .................. | 455/234.1 |
| 7,970,066 B1 * | 6/2011 | Lee et al. | ....................... | 375/260 |
| 2004/0151264 A1 * | 8/2004 | Montojo et al. | ............. | 375/345 |
| 2007/0054642 A1 | 3/2007 | Bhardwaj et al. | | |
| 2008/0070534 A1 * | 3/2008 | Lai | ............................. | 455/232.1 |
| 2008/0159446 A1 * | 7/2008 | Lai et al. | ....................... | 375/345 |
| 2008/0232518 A1 * | 9/2008 | Kim et al. | ..................... | 375/260 |

FOREIGN PATENT DOCUMENTS

KR    100431196    4/2004
KR    100668663    1/2007

* cited by examiner

*Primary Examiner* — Duc M Nguyen
(74) *Attorney, Agent, or Firm* — Nelson Mullins Riley & Scarborough LLP; EuiHoon Lee, Esq.

(57) ABSTRACT

A gain control apparatus in a receiver of multiband OFDM system includes: an amplifier amplifying a received signal based on a first auto gain control signal; an analog-to-digital converter for converting the amplified signal into a digital signal; band reception signal extractor for extracting a signal of a desired reception band from the converted digital signal for each reception band, and controlling gain of the extracted signal according to a second auto gain control signal; a reception power detector for detecting a reception power value of whole band from the converted digital signal; and a multiband integration baseband processor for generating the first auto gain control signal by using the detected reception power value of the whole band, and generating the second auto gain control signal to be provided to the band reception signal extraction units, resource allocation information for each band and a reception power for each reception band.

11 Claims, 3 Drawing Sheets

GAIN CONTROL APPARATUS AND METHOD IN RECEIVER OF MULTIBAND OFDM SYSTEM

CROSS-REFERENCE TO RELATED APPLICATIONS

This application claims the priority of Korean Patent Application No. 10-2008-0120955 filed on Dec. 2, 2008, in the Korean Intellectual Property Office, the disclosure of which is incorporated herein by reference.

The present invention claims priority of Korean Patent Application No. 10-2008-0120955, filed on Dec. 2, 2008, which is incorporated herein by reference.

BACKGROUND OF THE INVENTION

1. Field of the Invention

The present invention relates to a gain control apparatus and method in a receiver of a wireless communication system; and, more particularly, to a gain control apparatus and method in a receiver of a multiband Orthogonal Frequency Division Multiplexing (OFDM) system.

2. Description of Related Art

In a wireless communication system, it is important in view of the entire system capacity to properly control the transmission power of a signal to be transmitted. Accordingly, when transmitting a signal, the wireless communication system transmits the signal at a proper transmission power. The receiver of the wireless communication system, therefore, should maximize the gain of a signal which is transmitted at a proper transmission power to restore the signal. A gain control method is typically used to properly restore a signal.

Due to development of a wireless communication technology, the wireless communication system has evolved from a method for transmitting data through only one band into a method for transmitting signals through a plurality of bands. A representative system of the signal transmission method using the plurality of bands is a wireless communication system using an Orthogonal Frequency Division Multiplexing (OFDM) signal, and a system with the plurality of bands is called a multiband system. Controlling the gain of a received signal is more important in the receiver of a wireless communication system using an OFDM scheme and the multiband more than a system using a single band.

The following description will be made with reference to the accompanying drawing on a method for controlling the gain of a reception signal in the receiver of the wireless communication system using the multiband.

FIG. 1 is a block diagram illustrating a typical auto gain control apparatus in a receiver of a wireless communication system using a multiband scheme.

A received signal is inputted to an auto gain amplifier 101. The auto gain amplifier 101 controls the gain of the received signal by a gain value according to the control of the auto gain controller 103 to output a gain controlled signal. The reception signal which is outputted through the above-described gain control operation is inputted to an analog-to-digital converter (ADC) 102. The ADC 102 converts an inputted analog signal into a digital signal and outputs the digital signal. The signal outputted from the ADC 102 is inputted to the auto gain controller (AGC) 103 and two different mixers 104 and 105.

First, the auto gain controller 103 compares the power level of the inputted digital signal with a predetermined reference value, controls a gain according to the difference between the power level and the predetermined reference value, and outputs the gain control result to the auto gain amplifier 101. This is how the auto gain controller 103 controls the gain. The mixers 104 and 105 are constituent elements for extracting a signal based on each band. The mixers 104 and 105 also determine the gain of a received signal based on a control power received from the band gain control circuit 106 and output the gain-determined signal. The band gain control circuit 106 receives a power level for each band from the modem controller 107, compares the power level with signal levels outputted from the mixers 104 and 105, and determines the gain values of the mixers 104 and 105 according to the comparison result. As described above, a gain control method based on bands in a receiver compares the received power level with a predetermined reference value for each band and performs auto gain control according to the comparison result, compensating the gain of the reception signal.

The above-described method should perform gain control for each band, calculate the average value of a power level for longer than a predetermined time, and compare the average value with the reference value. Consequently, an error may occur in a wireless communication system using a burst mode like the OFDM system where a state of each band rapidly changes according to time. Such an error may increase the number of retransmission times and decrease the total system throughput due to the increased retransmission. Accordingly, it is required to develop an apparatus and method capable of reducing an error when performing auto gain control for each band in a system in which a state of each band rapidly changes according to time.

SUMMARY OF THE INVENTION

An embodiment of the present invention is directed to a gain control apparatus and method which control gain for each band in a wireless communication system using multiband.

Another embodiment of the present invention is directed to a gain control apparatus and method in a receiver which can improve throughput in a multiband system where a state of each band rapidly changes according to time.

Another embodiment of the present invention is directed to a gain control apparatus and method which can reduce the error of a received signal in a multiband system where a state of each band rapidly changes according to time.

In accordance with an aspect of the present invention, there is provided a gain control apparatus in a receiver of a multi-band Orthogonal Frequency Division Multiplexing (OFDM) system, the gain control apparatus including: an amplification unit configured to amplify a received signal based on a first auto gain control signal; an analog-to-digital conversion unit configured to convert the amplified signal into a digital signal; a plurality of band reception signal extraction units configured to extract a signal of a desired reception band from the converted digital signal for each reception band, and control a gain of the extracted signal according to a second auto gain control signal; a reception power detection unit configured to detect a reception power value of a whole band from the converted digital signal to output the detected value; and a multiband integration baseband processor configured to generate the first auto gain control signal by using the detected reception power value of the whole band, and generate the second auto gain control signal to be provided to the band reception signal extraction units by using power information of a whole band, resource allocation information for each band and a reception power for each reception band.

In accordance with another aspect of the present invention, there is provided a gain control method in a receiver of a multiband Orthogonal Frequency Division Multiplexing (OFDM) system, the gain control method including: receiving a multiband signal to detect a reception power, and primarily controlling a gain of the multiband signal by using the reception power; and secondarily controlling a gain of a band for receiving a signal by using resource allocation information of a reception band and power information which is allocated to the whole of the multiband.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter. In the following description, detailed descriptions of well-known functions or constructions will be omitted since they would obscure the invention to unnecessary detail. Also, the terms used herein are defined according to the functions of the present invention. Thus, the terms may vary depending on manufacturers or research groups. Therefore, the terms used herein should be understood based on the descriptions made herein.

Figure 1:
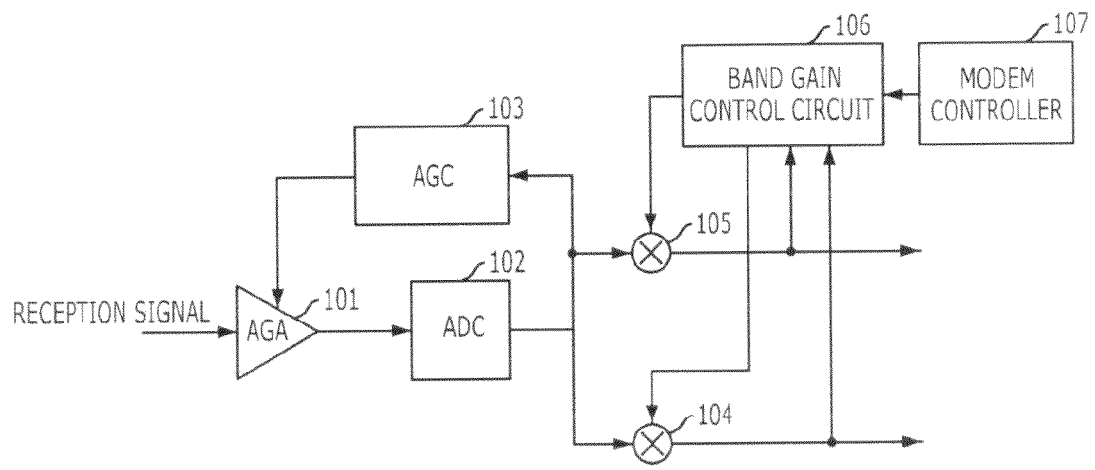
FIG. 1 is a block diagram illustrating a typical auto gain control apparatus in a receiver of a multiband wireless communication system.
Figure 2:
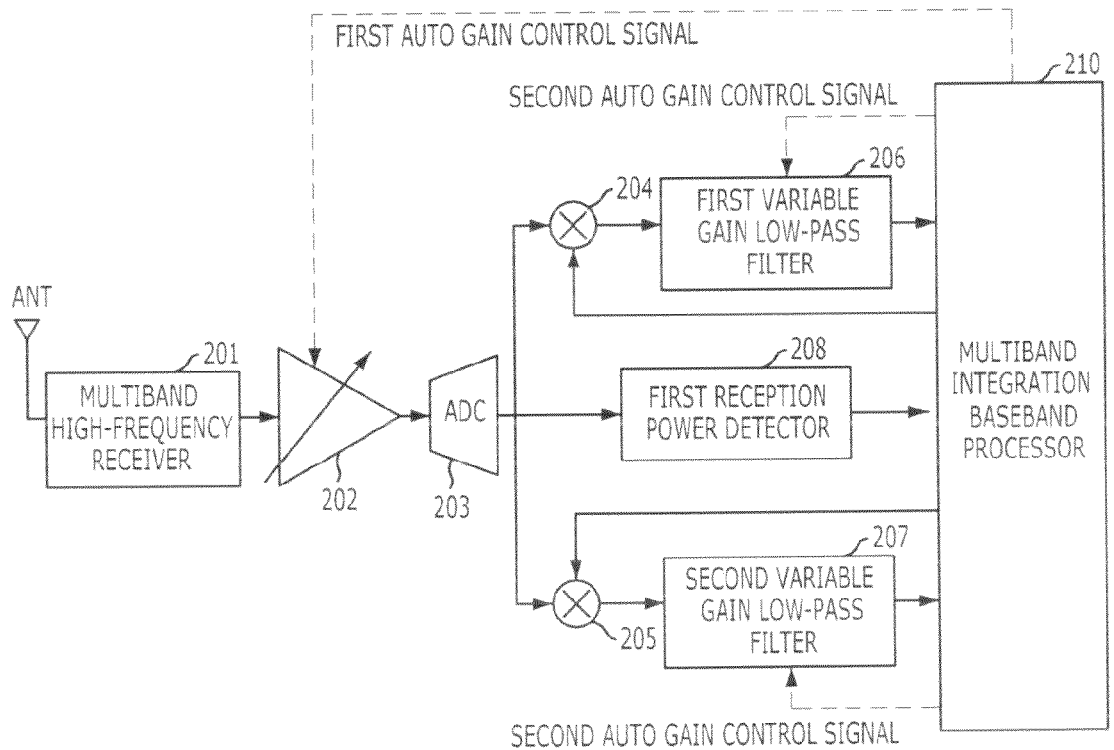
FIG. 2 is a block diagram illustrating an auto gain control apparatus in a receiver in accordance with an embodiment of the present invention.

FIG. 2 is a block diagram illustrating an auto gain control apparatus in a receiver in accordance with an embodiment of the present invention.

A signal received through an antenna ANT is inputted to a multiband high-frequency receiver 201. The multiband high-frequency receiver 201 receives the signal of a band which is set in a wireless communication system. Herein, since a system with multiband is disclosed as an example, the receiver for extracting only the signals of a reception band provided in the communication system is referred to as the multiband high-frequency receiver 201. A signal received from the multiband high-frequency receiver 201 is inputted to a multiband variable gain amplifier 202. The multiband variable gain amplifier 202 receives a first auto gain control signal provided from a below-described multiband integration baseband processor 210, and amplifies and outputs an inputted multiband signal. The multiband variable gain amplifier 202 is a typical auto gain amplifier. Herein, since the multiband system is disclosed as an example, the amplifier is called a multiband variable gain amplifier 202. In the following description, unless an auto gain amplifier and a multiband variable gain amplifier are defined separately, they are regarded as the same amplifiers.

A gain-amplified signal from the multiband variable gain amplifier 202 is inputted to an analog-to-digital converter (ADC) 203. The analog-to-digital converter 203 converts an analog signal amplified by the multiband variable gain amplifier 202 into a digital signal and outputs the converted digital signal. The signal outputted from the analog-to-digital converter 203 is inputted to a first mixer 204, a second mixer 205 and a first reception power detector 208. Herein, only the first and second mixers 204 and 205 are illustrated. This is because the embodiment of FIG. 2 exemplifies a receiver receiving two multiband signals. Accordingly, if a receiver receives more than three multiband signals, it includes three or more mixers.

The first mixer 204 extracts a digital signal corresponding to a first band. That is, the first mixer 204 converts a signal of the first band into a signal having a center frequency of 0 Hz, thereby outputting a desired baseband signal. In other words, the first mixer 204 performs mix using a frequency for extracting the signal corresponding to the first band from an inputted multiband signal, and thereby outputs the baseband signal of the first band. In this way, when the baseband signal is outputted, a first variable gain low-pass filter 206 extracts only the baseband signal of the first band to output the extracted baseband signal. Moreover, the first variable gain low-pass filter 206 receives a second auto gain control signal provided from the multiband integration baseband processor 210, and corrects the gain of a corresponding band signal to output the gain-corrected signal. In the embodiment of FIG. 2, it is assumed that the second auto gain control signal is inputted to the first variable gain low-pass filter 206. Gain control for each reception band, however, may be performed by the first mixer 204. Accordingly, the first mixer 204 may be realized to have varying gain.

As described above, the gain-corrected signal is inputted to the multiband integration baseband processor 210. The first mixer 204 and the first variable gain low-pass filter 206 are elements for processing the signal of the first band, whereas elements for processing the signal of a second band are the second mixer 205 and a second variable gain low-pass filter 207. Although the element for processing the signal of the second band and the element for processing the signal of the first band, therefore, process different signals, they have the same configuration and operation. Accordingly, repetitive description will be omitted.

The converted digital signal from the A/D converter 203 is inputted to the first reception power detector 208. The first reception power detector 208 checks the reception power level of the converted digital signal, and provides the check result to the multiband integration baseband processor 210.

The multiband integration baseband processor 210 includes a demodulator and a decoder for processing a baseband signal. The multiband integration baseband processor 210 is a baseband signal processor, i.e., modem, in the receiver of a typical wireless communication system. Since embodiments of the present invention are designed to process multiband signals, the baseband processor is called the multiband integration baseband processor 210. In the following description, a multiband baseband processor and a baseband processor will be used to refer to the same element, unless there is specific otherwise description.

The multiband integration baseband processor 210 demodulates and decodes a received signal. The multiband integration baseband processor 210 checks the total level of a power received from the first reception power detector 208.

The multiband integration baseband processor 210 generates and outputs the second auto gain control signal on the basis of resource allocation information for each band. The first auto gain control signal is a value for controlling the gain of the auto gain amplifier 202. The second auto gain control signal is a gain control signal for each band, and different gain control signals may be outputted according to the first and second bands. If the number of bands for signal reception is three or more, three or more gain control signals may be outputted as the second auto gain control signal. That is, the outputted second auto gain control signal includes gain control signals for respective bands.

An auto gain control method in the multiband integration baseband processor 210 will be described in detail hereafter in accordance with an embodiment of the present invention.

First, auto gain control based on the first auto gain control signal is used to control the gain of the received signal of a whole band by using a signal received from the first reception power detector 208. That is, the first reception power detector 208 measures the total power amount of a digital-converted multiband reception signal. The measured total power amount of the multiband reception signal is inputted to the multiband integration baseband processor 210. The multiband integration baseband processor 210 compares a predetermined reference value for power control with a power value measured by the first reception power detector 208, generates the first auto gain control signal for compensating for the difference between the reference value and the power value, and supplies the first auto gain control signal to the multiband variable gain amplifier 202. The multiband variable gain amplifier 202 may primarily control a gain for a whole band, and controls the signal inputted to the analog-to-digital converter 203 to stay at a proper signal level.

In the primarily gain-controlled signal, since only a gain for a whole band has been controlled, gain control for each band is required again. That is, different powers may be allocated for each band. Moreover, although the same power is allocated for each band, received power levels by band may be different due to transmission lines and wireless environments. Accordingly, it is required to control power for each band.

In the embodiments of the present invention, secondary power control is performed for each band as follows. First, embodiments of the present invention may use the power amount of a received signal. In addition, in the embodiments of the present invention, the secondary gain control is performed using the power amount of a received signal and an allocated frequency resource for each band. Before describing the secondary gain control, band classification in a wireless communication system using an OFDM scheme will be described with reference to FIG. 3.

Figure 3:
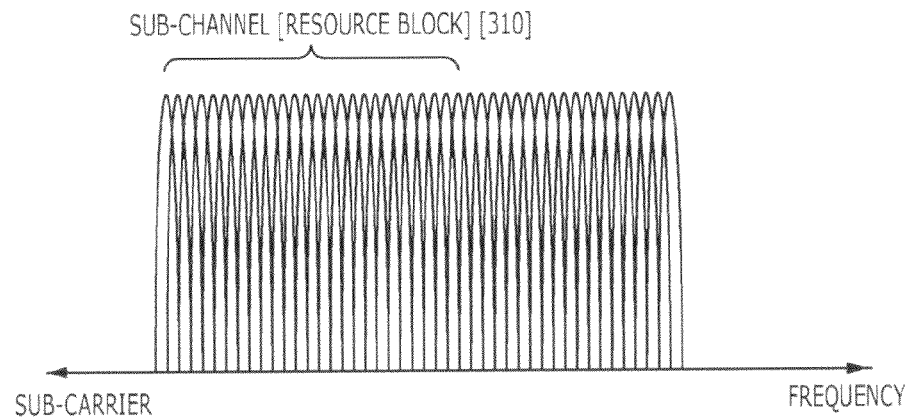
FIG. 3 is an exemplary diagram describing sub-channels, sub-carriers and resource blocks in a wireless communication frequency band.

FIG. 3 is an exemplary diagram describing sub-channels, sub-carriers and resource blocks in a wireless communication frequency band.

A wireless communication system using an OFDM system generally configures one band signal with a plurality of sub-carriers. The wireless communication system forms a sub-channel or resource block out of a plurality of sub-carriers. In the wireless communication system using the OFDM system, a base station allocates frequency resources on the basis of a sub-channel or a resource block, and transmits data to each terminal by using the allocated frequency resources. Subsequently, each terminal demodulates the resource allocated to it, thereby performing communication. At this point, the base station transmits information on a frequency resource (which is allocated on a resource block basis) to all terminals, and allows the terminals to smoothly receive data and to perform communication. FIG. 3 illustrates a sub-channel 310 including a plurality of sub-carriers. The sub-channel 310 may be formed of one resource block, or a plurality of resource blocks.

In embodiments of the present invention, the base station transmits information of the allocated resource block for each band to all the terminals and transmits power information of a whole band to all the terminals, in order to allow the terminals to perform auto gain control for each band.

Accordingly, the receiver of the terminal controls the gain of a corresponding band based on information of the resource block which is allocated for gain control for each band and power information of a whole band.

Figure 4:
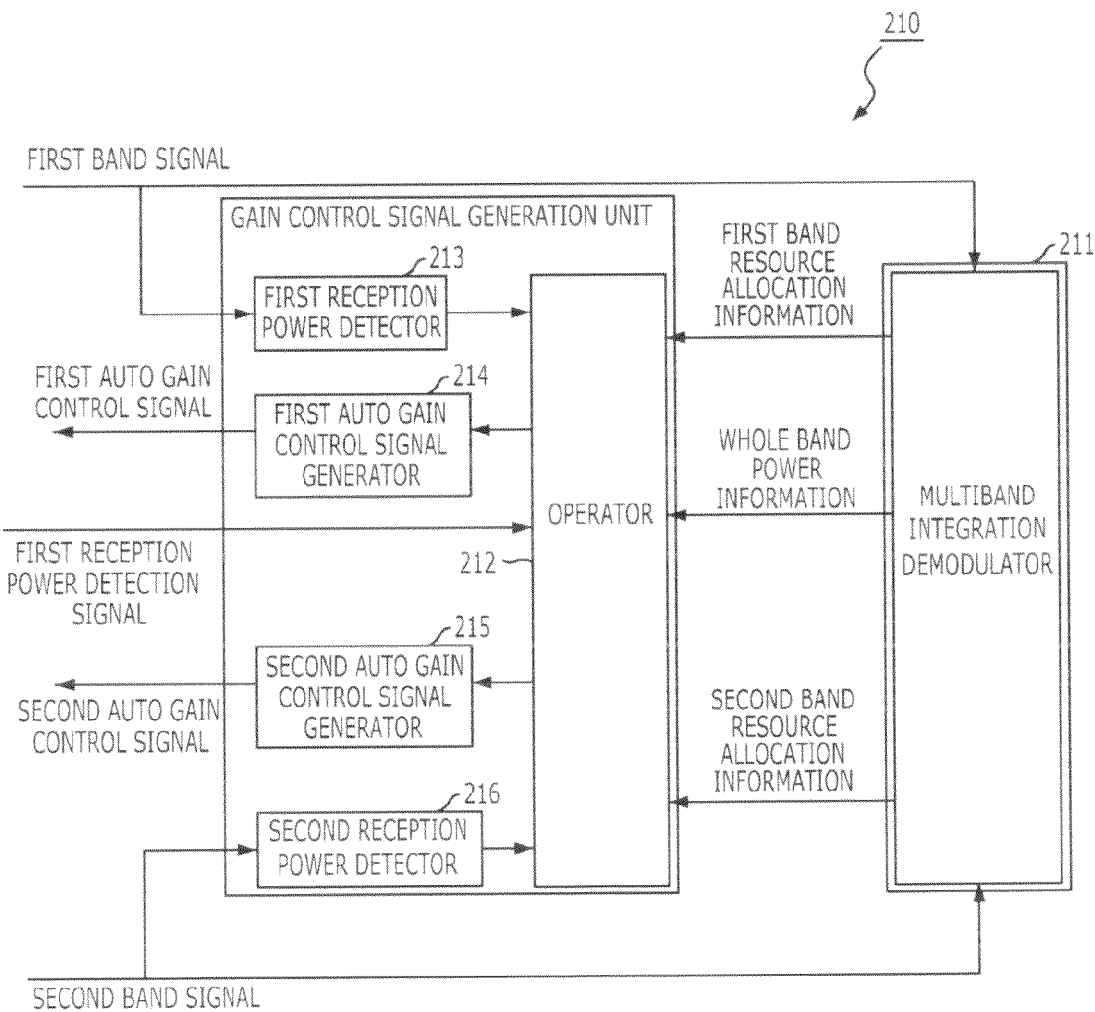
FIG. 4 is a block diagram illustrating a multiband integration baseband processor in accordance with an embodiment of the present invention.

FIG. 4 is a block diagram illustrating the multiband integration baseband processor in accordance with an embodiment of the present invention. Since FIG. 4 illustrates an embodiment using the structure of FIG. 2, it is assumed that a receiver receives only two bands. When three or more bands are received, however, it is apparent to those skilled in the art that the structure of FIG. 4 may be extended to a structure capable of receiving three or more band signals.

A multiband integration demodulator 211 receives a first band signal, a second band signal, power information of a whole band, and resource allocation information for each band. In FIG. 4, operations are not illustrated for receiving the power information of the whole band and the resource allocation information for each band. In the OFDM system, the power information of the whole band and the resource allocation information for each band are transmitted through a separate control channel or they are inserted to the header of data to be transmitted, before transmission of the data. Accordingly, the multiband integration demodulator 211 demodulates and/or decodes the information which is carried in the separate control channel or inserted in the header, and thereby acquires the power information of the whole band and the resource allocation information for each band.

The multiband integration demodulator 211 divides the acquired information into first band resource allocation information, second band resource allocation information and power information of the whole band, and provides the divided information to an operator 212 in a gain control signal generation unit. Herein, the gain control signal generation unit includes the operator 212, a first reception power detector 213, a first auto gain control signal generator 214, a second auto gain control signal generator 215, and a second reception power detector 216.

The first band signal is inputted to a first reception power detector 213, and the second band signal is inputted to a second reception power detector 216. The first reception power detector 213 receiving the first band signal and the second reception power detector 216 receiving the second band signal may be integrated into one reception power detector, or they may be configured separately as illustrated in FIG. 4. The first and second reception power detectors 213 and 216 receive each band signal, detect reception power for each band, and provide reception power signal for each band to the operator 212. Also, the operator 212 receives a first reception power detection signal generated by the first reception power detector 208. Subsequently, the operator 212 generates a gain control value for controlling the gain of the multiband variable gain amplifier 202 based on the first reception power detection signal, and provides the generated value to the first auto gain control signal generator 214. The first auto gain control signal generator 214 generates and outputs the first auto gain control signal to be provided to the multiband variable gain amplifier 202. That is, the operator 212 compares the first reception power detection signal with a predetermined reference value and thereby allows the first auto gain control signal generator 214 to generate the first auto gain control signal. Through these operations, a first auto gain control is performed. The first auto gain control described above is an auto gain control for a whole multiband signal, and it prevents saturation in the analog-to-digital converter 203.

The operator 212 receives a reception power for a signal received through the first band and a reception power for a signal received through the second band, and generates a signal for gain control for each band on the basis of information received from the multiband integration demodulator 211 to output the generated signal. Subsequently, the second auto gain control signal generator 215 generates a second auto gain control signal based on a gain value to be controlled for each band to output the generated signal.

A control signal generation method for generating the second auto gain control signal in the operator 212 will be described hereafter with reference to FIG. 5.

Figure 5:
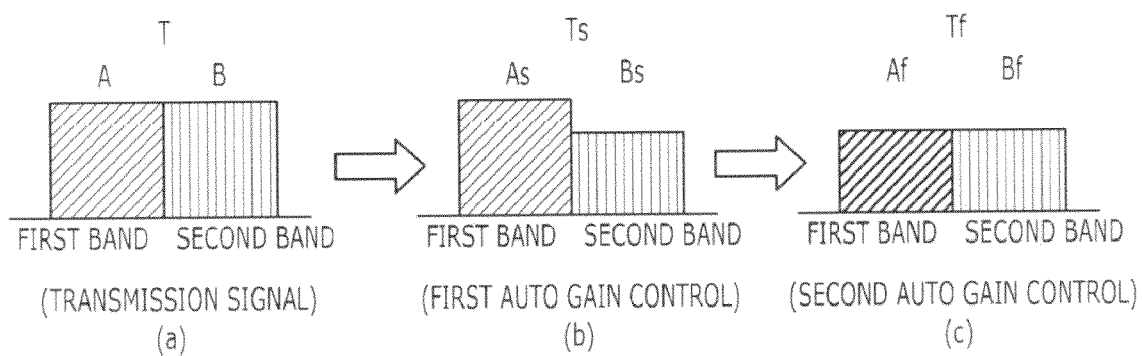
FIG. 5 is a conceptual view describing a gain correction process which is performed through generation of a second auto gain control signal in accordance with an embodiment of the present invention.

FIG. 5 is a conceptual view describing a gain correction process performed through generation of the second auto gain control signal in accordance with an embodiment of the present invention.

As illustrated in FIG. 5, it is assumed that the base station transmits a signal by making a power level as 'A' for the signal of the first band and transmits a signal by making a power level as 'B' for the signal of the second band. It is assumed that the total power level of a transmission signal is 'T.' In this case, although the same receiver receives a signal, the power attenuation of the same signal level does not occur in a signal for each band, according to the characteristics of a wireless communication system. That is, the signal is received through different attenuation for each band. Accordingly, the transmission signal in FIG. 5(a) may be received as shown in FIG. 5(b). In the received signal of FIG. 5(b), it is assumed that the reception power level of the first band is 'As,' the reception power level of the second band is 'Bs' and a total reception power level is 'Ts.'

The operator 212 may calculate the optimal power rate for each band from resource allocation information and 'T' being whole power information received from the base-station system. That is, the operator 212 may determine that the optimal power rate for the first band is 'A/T' and the optimal power rate for each band is 'B/T,' with the information. Since the operator 212 receives the power level of an auto gain-controlled signal through the first auto gain control signal, it receives a value where first auto gain control has been performed for each band. In the case of the first band, it can be seen that 'As/Ts' is a value inputted from the first reception power detector 213 for the first band after first auto gain control. In the case of the second band, it can be seen that 'Bs/Ts' is a value inputted from the second reception power detector 216 for the first band after first auto gain control.

The operator 212 measures the operated 'A/T,' the operated 'B/T' and the reception power for each band to obtain the 'As/Ts' and the 'Bs/Ts.' The operator 212 may compare the 'As/Ts' and the 'Bs/Ts' to control a gain for each band. As shown in FIG. 5(c), if a power value for each band required for smooth performance of demodulation and decode is 'Af' in the case of the first band and is 'Bf' in the case of the second band, the second auto gain control signal may be generated for each band to be the 'Af' and the 'Bf' by using the values. Referring to an example of FIG. 5, the operator 212 may control a gain for each band to have a small gain in the first band, and may control a gain for each band to have a large gain in the second band. As a result, a desired gain can be obtained for each band and a received signal is easily demodulated and decoded, in the wireless communication system with the multiband.

The operator 212 compares the 'A/T' and the 'B/T' which are operated for each band, compares the 'As/Bs' and the 'Bs/Ts' which are the power levels of the detected signals, and generates the second auto gain control signal for each band, thereby performing second auto gain control. Accordingly, the operator 212 finally controls a received signal with a multiband signal where a total power level is 'Tf' and power levels by band are 'Af' and 'Bf.' It can be seen that the power rate 'Af/Tf' of the controlled signal consists with the power rate 'A/T' of the transmission signal, and the power rate 'Bf/Tf' of the controlled signal consists with the power rate 'B/T' of the transmission signal.

The above-described power control method performs auto gain control on the basis of the resource allocation information changing according to time, and thus, can more quickly control a power than the existing method that compares a measured power level with a predetermined reference value to control a power.

According to the embodiments of the present invention, auto gain control is performed based on whole band power information and resource allocation information for each band. Thus, a power can be simply controlled only based on a power rate of each band and it is possible to quickly cope with a change of power based on resource allocation, which changes according to time.

While the present invention has been described with respect to the specific embodiments, it will be apparent to those skilled in the art that various changes and modifications may be made without departing from the spirit and scope of the invention as defined in the following claims.

What is claimed is:

1. A gain control apparatus in a receiver of a multiband Orthogonal Frequency Division Multiplexing (OFDM) system, the gain control apparatus, comprising:
   an amplification unit configured to amplify a reception signal based on a first auto gain control signal;
   an analog-to-digital conversion unit configured to convert the amplified signal into a digital signal;
   a plurality of band reception signal extraction units configured to extract a signal of a desired reception band from the digital signal for each reception band, and control a gain of the extracted signal according to a second auto gain control signal;
   a reception power detection unit configured to detect a reception power value of whole band from the digital signal to output the detected reception power value; and
   a multiband integration baseband processor configured to generate the first auto gain control signal by using the detected reception power value of the whole band, and generate the second auto gain control signal to be provided to the band reception signal extraction units by using power information of a whole band, resource allocation information for each band, and a reception power for each reception band.

2. The gain control apparatus of claim 1, wherein the band reception signal extraction unit comprises:
   a mixer configured to convert the digital signal into a baseband signal; and
   a low-pass filter configured to extract a signal of a reception band from the baseband signal outputted from the mixer.

3. The gain control apparatus of claim 2, wherein the mixer receives the second auto gain control signal to control a gain of the reception band.

4. The gain control apparatus of claim 3, wherein the multiband integration baseband processor comprises:
- a demodulator configured to generate the power information of the whole band and the resource allocation information for each reception band to output the generated information; and
- a gain control signal generation unit configured to generate the first auto gain control signal by using the reception power value of the whole band, and generate the second auto gain control signal by using the power information of the whole band, the resource allocation information for each reception band, and a reception power value of each reception band.

5. The gain control apparatus of claim 2, wherein the low-pass filter receives the second auto gain control signal to control a gain of the reception band.

6. The gain control apparatus of claim 5, wherein the multiband integration baseband processor comprises:
- a demodulator configured to generate the power information of the whole band and the resource allocation information for each reception band to output the generated information; and
- a gain control signal generation unit configured to generate the first auto gain control signal by using the reception power value of the whole band, and generate the second auto gain control signal by using the power information of the whole band, the resource allocation information for each reception band, and a reception power value of each reception band.

7. The gain control apparatus of claim 1, wherein the multiband integration baseband processor comprises:
- a demodulator configured to generate the power information of the whole band and the resource allocation information for each reception band to output the generated information; and
- a gain control signal generation unit configured to generate the first auto gain control signal by using the reception power value of the whole band, and generate the second auto gain control signal by using the power information of the whole band, the resource allocation information for each reception band, and a reception power value of each reception band.

8. The gain control apparatus of claim 7, wherein the gain control signal generation unit comprises:
- a reception power detector configured to detect a reception power for each reception band;
- an operator configured to calculate a second auto gain value by using the power information of the whole band, the resource allocation information for each reception band and the reception power value of the each reception band, and calculate a first auto gain value by using a reception power value of the whole band;
- a first auto gain signal generator configured to receive the first auto gain value from the operator to generate the first auto gain control signal; and
- a second auto gain signal generator configured to receive the second auto gain value for each reception band from the operator to generate the second auto gain control signal to be outputted for each reception band.

9. The gain control apparatus of claim 8, wherein the operator calculates the second auto gain value such that a whole power rate of respective reception bands is the same as a power rate for transmission by using the reception power of the each reception band, the resource allocation information for each band, and the power information of the whole band, when the second auto gain value is calculated.

10. A gain control method in a receiver of a multiband Orthogonal Frequency Division Multiplexing (OFDM) system, the gain control method comprising:
- receiving a multiband signal to detect a reception power, and primarily controlling a gain of the multiband signal by using the reception power; and
- secondarily controlling a gain of a band to receive a signal by using resource allocation information of a reception band and power information which is allocated to whole multiband,
- wherein the secondary gain control is performed on each band of the multiband signal.

11. The gain control method of claim 10, wherein in said secondarily controlling a gain, a whole power rate of respective reception bands is controlled to be the same as a power rate for transmission by using a reception power of the band to receive a signal, the resource allocation information for each band, and the power information for whole band.

* * * * *